(12) United States Patent
Mueller et al.

(10) Patent No.: US 10,914,776 B2
(45) Date of Patent: Feb. 9, 2021

(54) METHOD FOR DETECTING AN ERROR IN A GENERATOR UNIT

(71) Applicant: Robert Bosch GmbH, Stuttgart (DE)

(72) Inventors: Manuel Mueller, Kisslegg (DE);
Sebastian Paulus, Esslingen am Neckar (DE); Zoltan Ersek, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 271 days.

(21) Appl. No.: 16/073,727

(22) PCT Filed: Nov. 22, 2016

(86) PCT No.: PCT/EP2016/078367
§ 371 (c)(1),
(2) Date: Jul. 27, 2018

(87) PCT Pub. No.: WO2017/129285
PCT Pub. Date: Aug. 3, 2017

(65) Prior Publication Data
US 2019/0011488 A1    Jan. 10, 2019

(30) Foreign Application Priority Data

Jan. 27, 2016 (DE) .................. 10 2016 201 127

(51) Int. Cl.
*G01R 31/00* (2006.01)
*G01R 31/34* (2020.01)
(Continued)

(52) U.S. Cl.
CPC .......... *G01R 31/007* (2013.01); *B60L 3/0061* (2013.01); *B60L 3/12* (2013.01);
(Continued)

(58) Field of Classification Search
CPC ...... G01R 31/007; G01R 31/50; G01R 31/52; G01R 31/42; G01R 31/343; B60L 3/0061;
(Continued)

(56) References Cited

U.S. PATENT DOCUMENTS 5,252,915 A    10/1993 Sedding et al.
5,252,926 A    10/1993 Menegoli
(Continued)

FOREIGN PATENT DOCUMENTS

DE    69327066    6/2000
DE    10028135    12/2001
(Continued)

OTHER PUBLICATIONS

International Search Report for Application No. PCT/EP2016/078367 dated Feb. 21, 2017 (English Translation, 3 pages).

*Primary Examiner* — David Luo
(74) *Attorney, Agent, or Firm* — Michael Best & Friedrich LLP (57) ABSTRACT

The invention relates to a method for detecting an error in a generator unit which has an electric machine (100) with a rotor winding (110), a stator winding (120), and a rectifier (130) connected thereto, via which the electric machine (100) is connected to an onboard electrical system (150) of a motor vehicle, wherein a voltage of the onboard electrical system (150) is controlled to a target value via an excitation current ($I_E$) through the rotor winding (110) of the electric machine (100), and a curve of a phase voltage ($U_y$) of the stator winding (120) is monitored, wherein an error in the
(Continued)

generator unit is inferred when a change of the phase voltage ($U_y$) is detected and a voltage of the onboard electrical system (150) changing within a threshold value range (S) is detected.

9 Claims, 5 Drawing Sheets

(51) Int. Cl.
| | |
|---|---|
| *B60L 3/00* | (2019.01) |
| *G01R 31/42* | (2006.01) |
| *H02P 29/024* | (2016.01) |
| *B60L 3/12* | (2006.01) |
| *G01R 31/50* | (2020.01) |
| *H02P 9/00* | (2006.01) |
| *H02P 101/45* | (2016.01) |
| *H02P 103/20* | (2016.01) |
| *H02P 9/48* | (2006.01) |

(52) U.S. Cl.
CPC ........... *G01R 31/343* (2013.01); *G01R 31/42* (2013.01); *G01R 31/50* (2020.01); *H02P 9/006* (2013.01); *H02P 29/0241* (2016.02); *H02P 9/48* (2013.01); *H02P 2101/45* (2015.01); *H02P 2103/20* (2015.01); *Y02T 10/64* (2013.01)

(58) Field of Classification Search
CPC ...... B60L 3/12; Y02T 10/642; H02P 2101/45; H02P 2103/20; H02P 29/0241; H02P 9/006; H02P 9/48
USPC .............................................. 361/20; 318/34
See application file for complete search history.

(56) References Cited

U.S. PATENT DOCUMENTS

| | | | | |
|---|---|---|---|---|
| 6,140,915 | A * | 10/2000 | Iwatani | H02H 7/06 322/28 |
| 6,262,550 | B1 * | 7/2001 | Kliman | G05B 23/0264 318/565 |
| 6,288,507 | B1 * | 9/2001 | Makino | H02P 7/29 318/292 |
| 7,479,756 | B2 * | 1/2009 | Kasunich | H02H 7/1216 318/731 |
| 2015/0091606 | A1 | 4/2015 | Ge et al. | |

FOREIGN PATENT DOCUMENTS

| | | |
|---|---|---|
| DE | 102013109546 | 3/2014 |
| DE | 102013200637 | 7/2014 |
| DE | 102013224756 | 6/2015 |
| WO | 2005122388 | 12/2005 |

* cited by examiner

METHOD FOR DETECTING AN ERROR IN A GENERATOR UNIT

BACKGROUND OF THE INVENTION

The present invention relates to a method for detecting an error in a generator unit and to a processing unit, in particular a generator controller, and a computer program for its implementation.

Motor vehicles are equipped with an onboard electrical network, which is supplied with voltage via an electrical machine operated as a generator, for example, a separate-excited synchronous machine. To regulate the onboard electrical network voltage, an excitation current of the electrical machine can be controlled. In this case the electrical machine is usually connected to the onboard electrical network by a rectifier, with which it forms a generator unit. In such generator units, faults can occur, such as short circuits, which should be detected if possible.

DE 1020 1320 0637 A1 discloses a method for detecting an error in the rectifier. The method comprises at least one excitation current value of an excitation through an excitation winding of the generator, determining at least one characteristic value that corresponds to a current-carrying component of at least one of the rectifier elements. From this it is determined whether an electrical fault is present.

SUMMARY OF THE INVENTION

A method according to the invention is used for detecting an error in a generator unit, which has an electrical machine with rotor winding and stator winding and a rectifier connected thereto, by means of which the electrical machine is connected to an onboard electrical network of a motor vehicle. A voltage of the onboard electrical network is regulated to a nominal value using an excitation current flowing through the rotor winding of the electric machine as a control variable. In addition, at least one temporal progression of a phase voltage is monitored. If any change in the phase voltage and a changing voltage within a threshold band of the onboard electrical network are detected, an error is assumed to exist in the generator unit, i.e. in the electrical machine and/or the rectifier.

In this way, it is a simple matter to detect different types of errors in the rectifier and/or the electrical machine. This is possible because such errors affect the phase voltages of at least one of the phases. The phase voltage is preferably determined against a fixed reference potential, e.g. ground.

It has been recognized that changes in at least one of the phase voltages occur simultaneously with a variation in the progression of the voltage of the onboard electrical network within a threshold band, in particular when non-uniformities are induced in the phase currents, e.g. due to a short circuit or an interruption. Such defects typically give rise to compensatory effects within the electrical machine, which are manifested in a change in the system variables that is characteristic of the particular error, in particular in one of the phase voltages. Since such characteristic variations are particularly easy to detect, this results in a simple and effective way of detecting errors in the rectifier and/or the electrical machine. In addition, the temporal progression of the onboard electrical network voltage within a threshold band can be used as an additional criterion for error detection.

Preferably, an error is assumed to exist in the generator unit when an oscillating progression of the variation in the temporal width of the pulse of the phase voltage is detected, wherein the magnitude of the oscillations exceeds a threshold value.

Such errors typically give rise to compensatory effects within the electrical machine, which are manifested in a change in the system variables which is characteristic of the particular error, wherein in particular, such compensatory effects usually produce an oscillatory component. Such an oscillatory behavior is characteristic of errors of this type, which means an error can be detected particularly easily, in particular by determining the amplitude of the oscillation. The amplitude of the oscillation is understood to mean a difference between the maximum value and the instantaneous mean value (for example, effective value (root-mean-square value, RMS), or moving average) during an oscillation period. The temporal width of the pulses of the phase voltage can be defined as the width of a pulse at a maximum value, or the full-width at half-maximum.

In addition, it is preferred that the changing voltage of the onboard electrical network within a threshold band has an essentially constant mean progression. The mean progression is defined as a temporal sequence of instantaneous mean values (for example, effective value (root-mean-square value, RMS), or moving average) during an oscillation period. By such a criterion, the progression of the voltage of the onboard electrical network within a threshold band can be acquired in a manner which is less sensitive to interference effects, which facilitates a reliable detection of an error.

Preferably, an error is assumed to exist in the generator unit only if the frequency of the oscillating progression of the variation in the temporal width of the pulses of the phase voltage is proportional to the number of pole pairs of the electrical machine and/or to a current rotation speed of the electrical machine. This allows external influences that may have an impact on the size of the oscillation to be suppressed.

Advantageously, the fault comprises a short circuit and/or an interruption in a high-side path between the rectifier and the on-board network, a short circuit and/or an interruption in a low-side path between the rectifier and the on-board network, and/or a short circuit of phases to each other. In the electrical machine, the error can be a short-circuit of the stator to the on-board network, i.e. to positive (B+) and/or negative (B−) voltage, a break in a wire of the stator winding, a short circuit between wires of the stator winding, and/or a short circuit between different phases. Since an electrical machine, such as a separate-excited synchronous machine has, for example, three or five phases, an error can also occur that covers different phases, although this is actually unlikely. By the same token, for example, errors comprising a short-circuit and a breakage of two different paths may also occur. The above-mentioned errors represent the commonly occurring errors in generator units. In particular, short circuits or breaks of a path lead to significant oscillations in at least one of the phase voltages, which can be easily detected.

This method, when compared to the above-mentioned known method with monitoring of the excitation current, has the advantage that detecting and evaluating one of the phase voltages makes it particularly simple to detect a rectifier defect, in particular one of the above-mentioned defects, since such a defect typically has a direct effect on one of the phase voltages. The aforementioned errors can be detected and distinguished, in particular, on the basis of their oscillation amplitude and/or oscillation frequency and/or signal pattern.

It is advantageous if a countermeasure is performed when, or as soon as, an error has been determined in the generator unit. In particular, the countermeasure comprises a reduction of the excitation current, in particular by reducing the nominal value of the excitation current, and/or a reduction of a maximum permissible excitation current and/or an error message. On the one hand, this allows the on-board network, and in particular any connected consumers, to be quickly and easily protected from damage. In addition, the electrical machine can be protected against overheating and, on the other hand, for example, a driver of the vehicle can be warned and urged to visit a workshop.

A processing unit according to the invention, in particular a generator regulator, for example a control unit of a motor vehicle, is configured, in particular by software means, for implementing a method according to the invention.

Further advantages and embodiments of the invention are derived from the description and the enclosed drawing.

The invention is shown schematically in the drawing by reference to an exemplary embodiment and is described in detail in the following with reference to the drawing.

DETAILED DESCRIPTION

Figure 1:
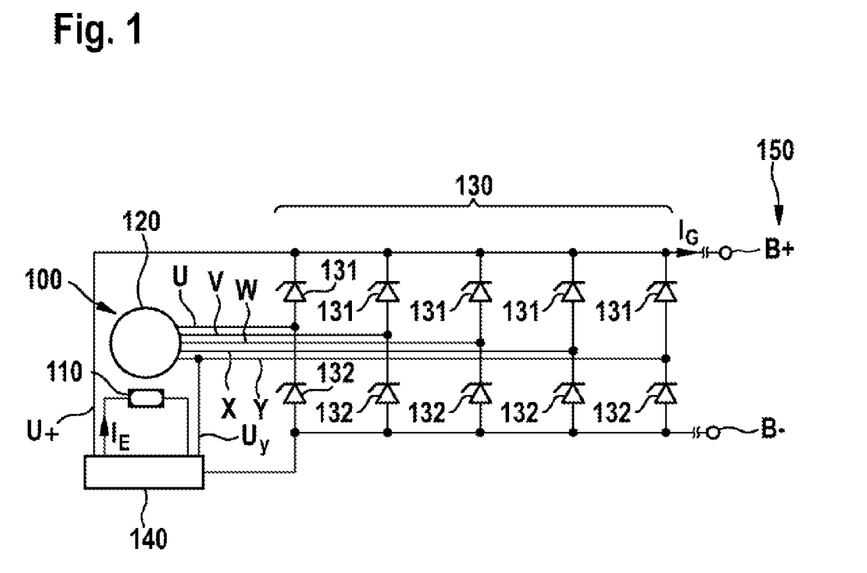
FIG. 1 shows a schematic diagram of a generator unit with an electric machine, rectifier and generator regulator, in which a method according to the invention can be implemented.

FIG. 1 shows a schematic diagram of a generator unit having an electrical machine 100 with a rectifier 130 and a processing unit 140 designed as a generator regulator, in which a method according to the invention can be implemented. The electrical machine 100 has a rotor or excitation winding 110 and a stator winding 120, and in this case is used as a generator for supplying power to an on-board electrical network 150 of a motor vehicle.

The electric machine 100 and therefore its stator winding 120 is in this case designed with five phases U, V, W, X and Z. Each of the five phases is linked via an associated diode 131 of the rectifier 130 to a positive side, or high-side B+ of the onboard network 150 and via an associated diode 132 to a negative side, or low-side B− of the onboard network 150. It goes without saying that the number five of the phases in the present case is only exemplary and that a method according to the invention can also be implemented with a different phase number, for example 3, 6, 7 or more. It is also possible to use suitable semiconductor switches instead of the diodes.

The generator regulator 140 supplies the rotor winding 110 with an excitation current $I_E$. Furthermore, the generator regulator 140 has inputs for detecting the on-board electrical network voltage with B+ and B−, as well as a phase voltage, which is in the present case is the phase Y, with voltage $U_Y$. An output current delivered by the electrical machine 100 is designated with $I_G$.

Figure 2A:
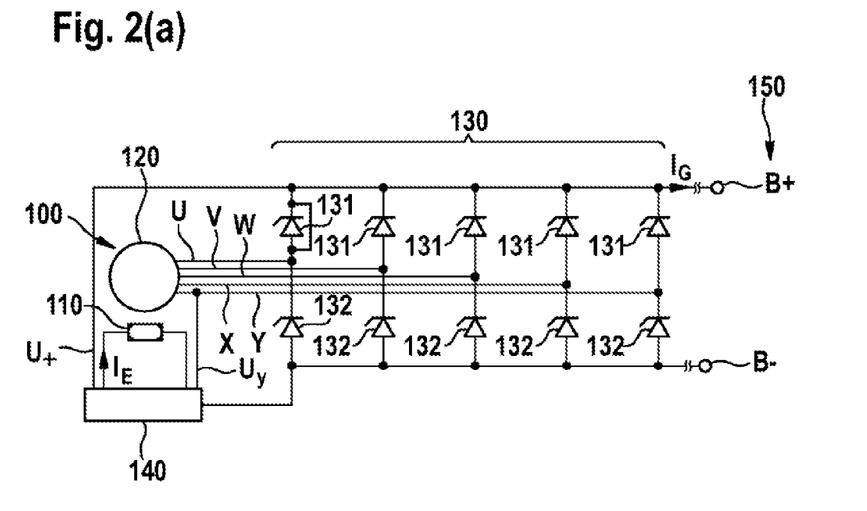
FIGS. 2a to 2c show the generator unit of FIG. 1 with different errors in the rectifier.
Figure 2B:
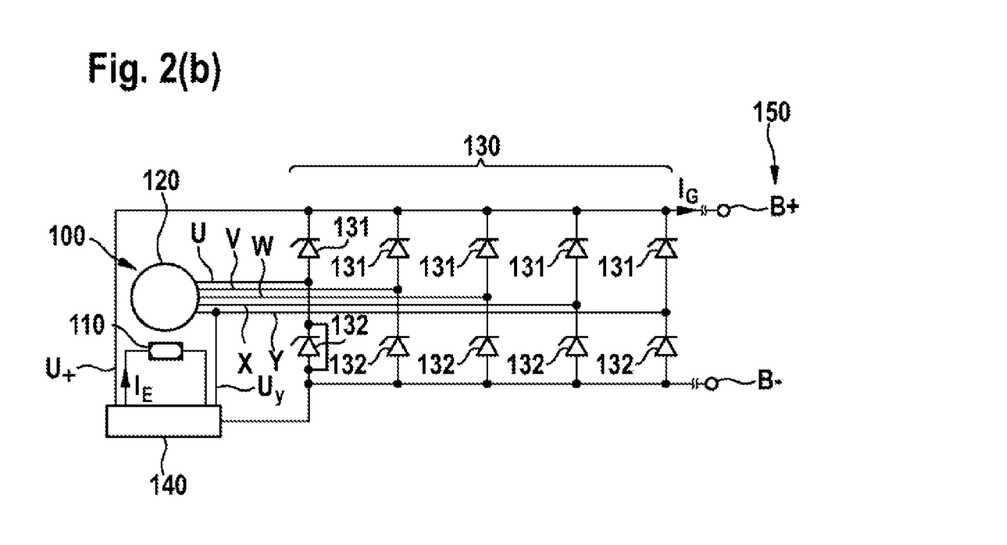
Figure 2C:
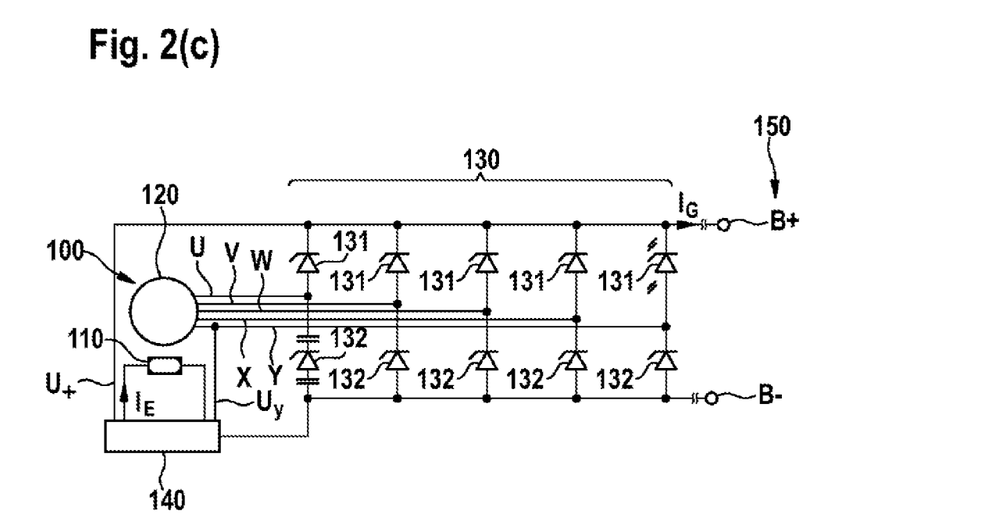

In FIGS. 2a to 2c, respectively, the arrangement shown in FIG. 1 is shown, each with a specific error in the rectifier 130.

FIG. 2a shows an example of a short-circuit in the high-side path, in the present case in the phase U. This can occur, for example, in the event of a short-circuit of the associated diode 131.

FIG. 2b shows an example of a short-circuit in the low-side path, in the present case in the phase U. This can occur, for example, in the event of a short-circuit of the associated diode 132.

FIG. 2c shows an example of an interruption in a low-side path, in the present case in the phase U. Such an interruption occurs, for example, if the associated diode 132 is disconnected on one side of the diode, or, as shown in the figure, on both sides of the diode, or if the diode is destroyed, for example. An interruption in a high-side path would accordingly occur, for example, in the case of a disconnection or destruction of a diode 131.

Figure 3A:
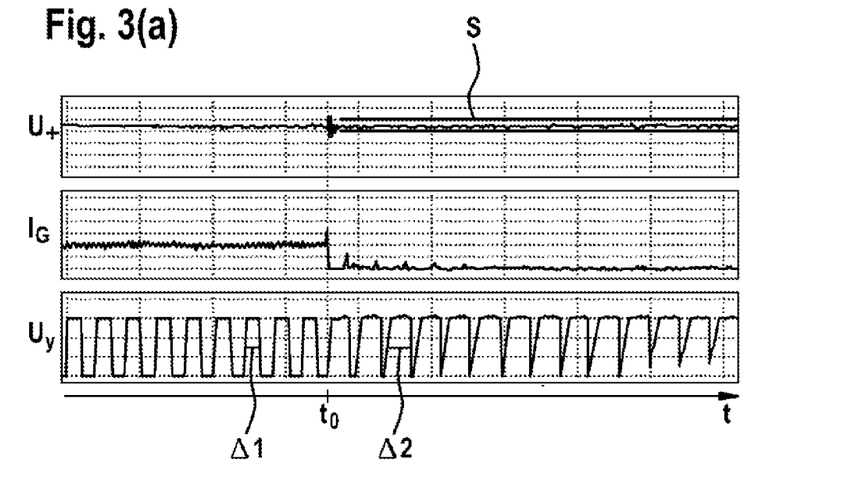
FIGS. 3a to 3c show diagrams of voltage and current waveforms for the errors shown in FIGS. 2a to 2c.
Figure 3B:
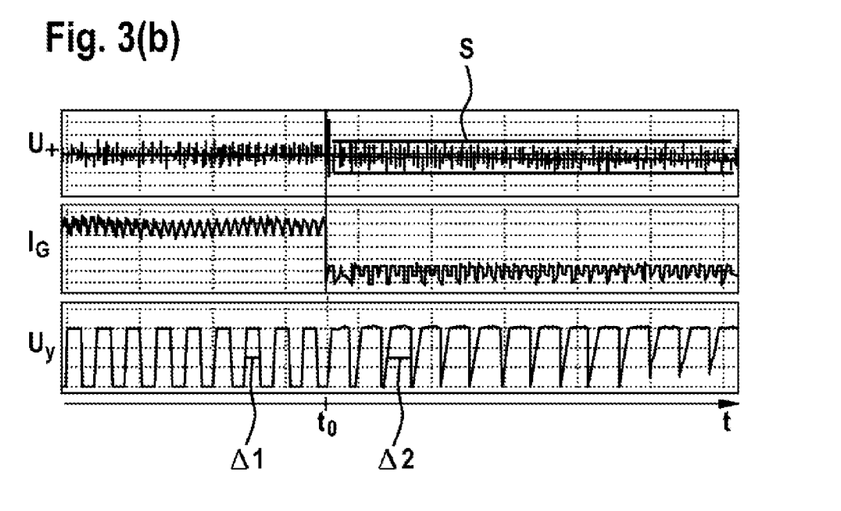
Figure 3C:
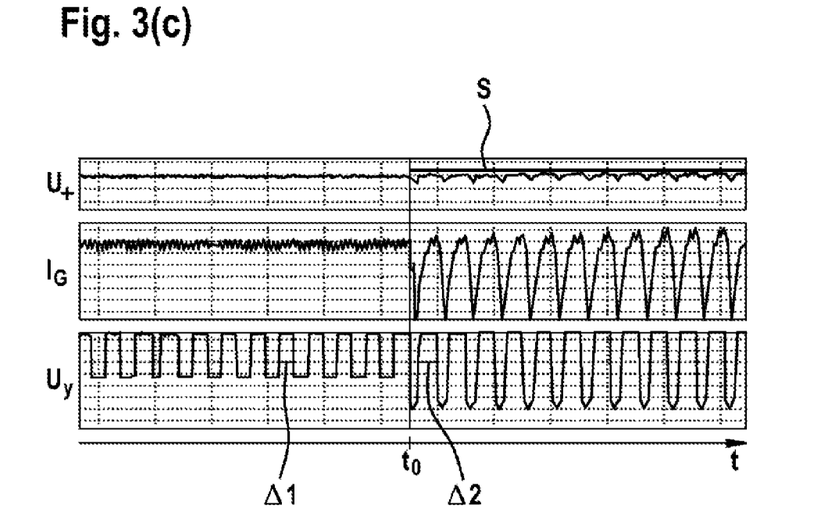

FIGS. 3a to 3c show waveforms of the generator voltage U+, the generator current $I_G$, the phase voltage $U_Y$ of the phase Y and of the excitation current $I_E$ over time t, respectively. Before time $t_0$ a normal operation of the arrangement prevails and at time $t_0$ a fault occurs in the generator unit. The curves in FIGS. 3a to 3c are associated with waveforms, which correspond to errors as shown in FIGS. 2a to 2c. It should be noted here that the scaling of the individual diagrams for both current and voltage as well as for time does not always match, but this is not relevant to the present invention.

In FIG. 3a it is apparent that a short circuit in a high-side path becomes noticeable in the generator voltage just a short time after the error has occurred. The generator voltage after time $t_0$ thus shows a typical waveform within a threshold band S and has a substantially constant mean temporal progression. The waveform within the threshold bands S, however, is not absolutely necessary for error detection, but it can be used as an additional criterion. The generator current decreases and the phase voltage $U_Y$ varies in such a way that the temporal width $\Delta 2$ of the pulses of the phase voltage $U_Y$ after the error differs significantly from the temporal width $\Delta 1$ of the pulses of the phase voltage $U_Y$ before the error. On closer examination, the temporal variation in the width of the phase voltage $U_Y$ also has a temporally oscillating progression compared to the waveform without error. The frequency f of the oscillation of the width of the phase voltage $U_Y$ here corresponds to:

$$f = n \cdot PPZ/60,$$

where n is the rotation speed of the generator in 1/min and PPZ is the number of pole pairs of the generator.

In FIG. 3b it is apparent that a short circuit in a low-side path is noticeable in the generator voltage just a short time after the error has occurred, and that the generator current decreases. The generator voltage after time $t_0$ thus also shows a typical waveform within a threshold band S and has a substantially constant mean temporal progression. The waveform within the threshold bands S, however, is not absolutely necessary for error detection, but it can be used as an additional criterion. In the phase voltage $U_Y$, as also in the short-circuit in the high-side path (FIG. 3a), a significant variation in the temporal width $\Delta 2$ of the pulses of the phase voltage $U_Y$ is apparent following the error, compared to the temporal width $\Delta 1$ of the pulses of the phase voltage $U_Y$ before the error. On closer examination, the temporal variation in the width of the phase voltage $U_Y$ also has a temporally oscillating waveform in comparison to the waveform without error, wherein the frequency f of the oscillation of the width of the phase voltage $U_Y$ follows the same relationships as shown in FIG. 3a.

In FIG. 3c it is apparent that an interruption in a low-side path leads to slight fluctuations in the generator voltage, which typically varies within a threshold band S and has an essentially constant mean temporal progression. The waveform within the threshold bands S, however, is not absolutely necessary for error detection, but it can be used as an additional criterion. The generator current follows an oscillation, in which the value of the current on reaching the respective disconnected low-side path in each case tends to zero. The phase voltage $U_Y$ has a higher amplitude than before the error, and a significant variation in the temporal width $\Delta 2$ of the pulses of the phase voltage $U_Y$ is also apparent following the error, compared to the temporal width $\Delta 1$ of the pulses of the phase voltage $U_Y$ before the error. On closer examination, the temporal variation in the width of the phase voltage $U_Y$ also has a temporally oscillating waveform in comparison to the waveform without error, wherein the frequency f of the oscillation of the width of the phase voltage $U_Y$ follows the same relationships as shown in FIG. 3a.

In summary, it is evident that on the basis of the phase voltage in conjunction with a substantially constant generator voltage, all the errors referred to in the rectifier and/or the machine can be detected. Since both the phase voltage and the generator voltage can already be detected due to the regulation in the generator regulator, the method can be implemented very easily without additional constructive effort.

Figure 4:
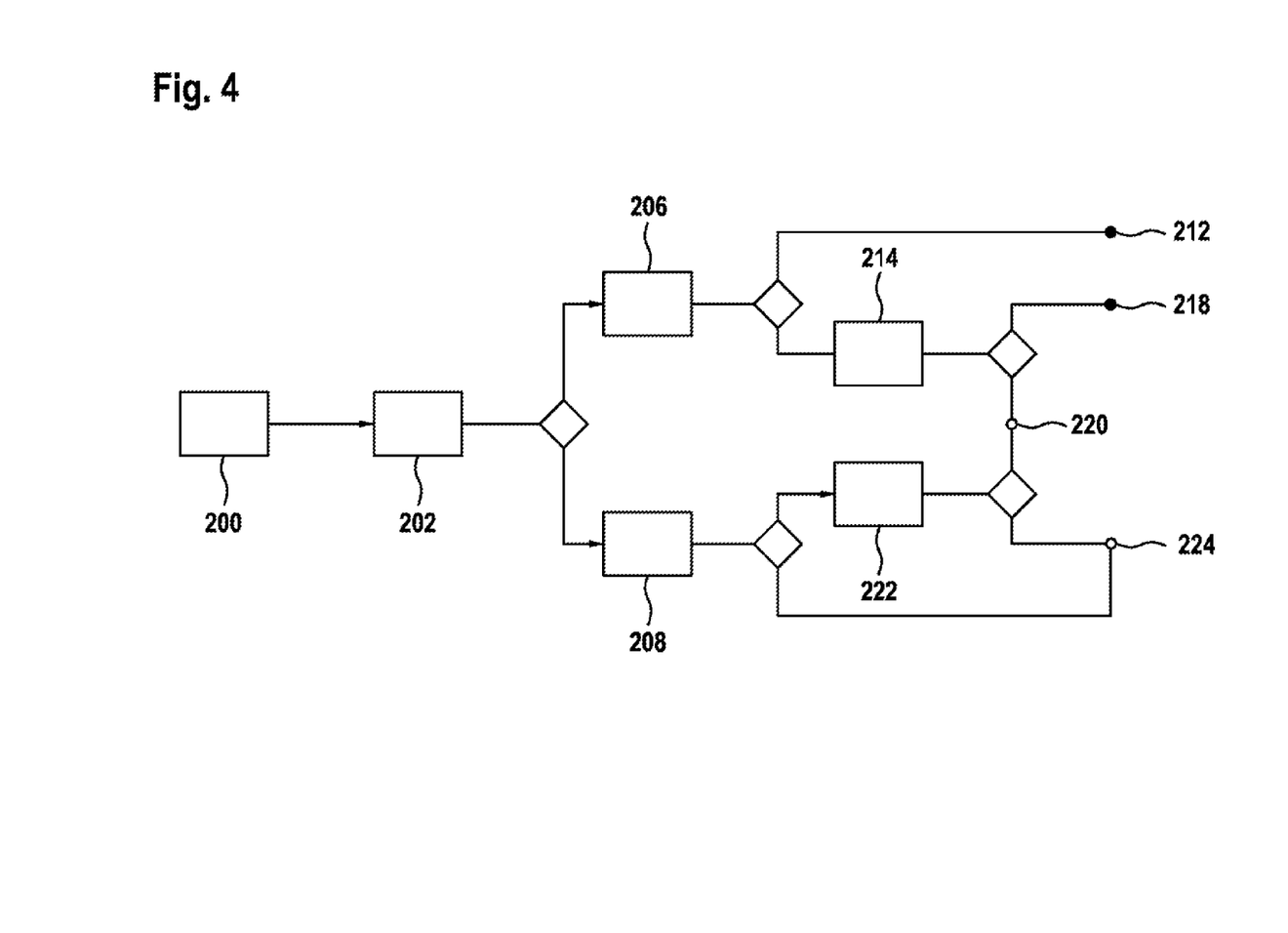
FIG. 4 shows a flowchart for a method for detecting a fault in the generator.

FIG. 4 shows an example flow chart for a method for detecting an error in a generator unit. In step 200, the temporal width of the pulses of the phase voltage $U_Y$ is determined and, if appropriate, stored in a memory for further processing. In step 202, the temporal widths of the individual pulses of the phase voltage $U_Y$ are compared with each other in order to determine whether a significant deviation in the temporal pulse widths exceeding a threshold value exists. It can also be checked in 206 and 208 whether the pulse widths are subject to an oscillatory variation.

In the event that 202 evaluates negative and 206 is also negative, there is no error in the system. In the event that 202 evaluates negative and 206 evaluates in the affirmative, in step 214 it can be checked whether the voltage of the onboard electrical network 115 varies within a threshold band S and/or whether it has a substantially constant mean temporal progression. If the outcome of step 214 is negative, the system is in an undefined state 218 and, if necessary, an error message can be output and/or the state can be checked for plausibility by one of the other measured values shown in FIG. 3. If step 214 evaluates in the affirmative, then the generator has a defect 220.

In the event that 202 evaluates in the affirmative and 208 (presence of an oscillatory variation) also evaluates in the affirmative, it can be checked whether the voltage of the onboard electrical network 115 varies within a threshold band S and/or whether it has a substantially constant mean temporal progression 222. In the event that 208 is affirmative and 222 is also affirmative, there is a fault in the generator 220. If step 208 is affirmative and 222 evaluates negative, the system is in an undefined state 224 and, if necessary, an error message can be output, and/or the state can be checked for plausibility by one of the other measured values shown in FIG. 3. The same applies to the case in which 208 evaluates negative.

The invention claimed is:

1. A method for detecting an error in a generator, the generator including an electrical machine with a rotor winding and a stator winding and a rectifier, the method comprising:
    connecting, via the rectifier, the electrical machine to an on-board electrical network of a motor vehicle,
    regulating, via an excitation current through the rotor winding of the electrical machine, a voltage of the onboard network to a nominal value, and
    monitoring, with a computer, a waveform of a phase voltage of the stator winding, wherein an error is assumed to exist in the generator unit if a change in the phase voltage is detected and wherein the error is assumed to exist in the generator unit if a voltage varying within a threshold band of the onboard network is also detected and/or an oscillating progression of the variation in the temporal width of the pulse of the phase voltage is detected, and wherein a magnitude of the oscillation exceeds a threshold, or an increased amplitude of the pulses of the phase voltage is detected.

2. The method as claimed in claim 1, wherein a frequency of the oscillation is proportional to a number of pole pairs and/or a current rotation speed of the electrical machine.

3. The method as claimed in claim 1, wherein the fault comprises a short circuit and/or an interruption in a high-side path between the rectifier and the onboard network, a short circuit and/or an interruption in a low-side path between the rectifier and the onboard network, a short circuit of the stator winding in relation to the onboard network, a break in a wire of the stator winding, a short circuit between wires of the stator winding and/or a short circuit between different phases.

4. The method as claimed in claim 1, wherein a nature of the error is inferred on the basis of the magnitude of the oscillation and/or on the basis of a frequency of the oscillation and/or on the basis of the oscillating progression of the variation in the phase voltage.

5. The method as claimed in claim 1, wherein a countermeasure is carried out if an error in the generator unit is determined.

6. The method as claimed in claim 5, wherein the countermeasure comprises a reduction of the magnitude of the excitation current, in particular by reducing the nominal value of the excitation current, and/or a reduction of a maximum permissible excitation current and/or an error message.

7. The method as claimed in claim 1, wherein the excitation current is regulated to a nominal value.

8. A generator regulator configured to control a generator having an electric machine connected, via a rectifier, to an on-board electrical network of a motor vehicle and having a computer configured to implement a method of controlling the generator, the method comprising:
    regulating, via an excitation current through a rotor winding of the electrical machine, a voltage of the onboard network to a nominal value, and
    monitoring, a waveform of a phase voltage of a stator winding of the electrical machine, wherein an error is assumed to exist in the generator if a change in the phase voltage is detected and wherein the error is assumed to exist in the generator unit if a voltage varying within a threshold band of the onboard network is also detected and/or an oscillating progression of the variation in the temporal width of the pulse of the phase voltage is detected, and wherein a magnitude of the oscillation exceeds a threshold, or an increased amplitude of the pulses of the phase voltage is detected.

9. A machine-readable storage medium having a computer program that when implemented by a computer causes the computer to implement a method of controlling a generator having an electric machine connected, via a rectifier, to an on-board electrical network of a motor vehicle, the method comprising:

regulating, via an excitation current through a rotor winding of the electrical machine, a voltage of the onboard network to a nominal value, and monitoring, a waveform of a phase voltage of a stator winding of the electrical machine, wherein an error is assumed to exist in the generator if a change in the phase voltage is detected and wherein the error is assumed to exist in the generator unit if a voltage varying within a threshold band of the onboard network is also detected and/or an oscillating progression of the variation in the temporal width of the pulse of the phase voltage is detected, and wherein a magnitude of the oscillation exceeds a threshold, or an increased amplitude of the pulses of the phase voltage is detected.

\* \* \* \* \*